(12) United States Patent
Taylor

(10) Patent No.: US 11,598,890 B2
(45) Date of Patent: Mar. 7, 2023

(54) ION BEAM PROFILING SYSTEM AND RELATED METHODS

(71) Applicant: Battelle Energy Alliance, LLC, Idaho Falls, ID (US)

(72) Inventor: Chase N. Taylor, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 217 days.

(21) Appl. No.: 16/946,344

(22) Filed: Jun. 17, 2020

(65) Prior Publication Data
US 2021/0396894 A1 Dec. 23, 2021

(51) Int. Cl.
| G01T 1/29 | (2006.01) |
| H01J 37/252 | (2006.01) |
| H01J 37/317 | (2006.01) |
| H01J 37/24 | (2006.01) |

(52) U.S. Cl.
CPC .......... *G01T 1/2921* (2013.01); *H01J 37/243* (2013.01); *H01J 37/252* (2013.01); *H01J 37/3171* (2013.01); *H01J 2237/245* (2013.01); *H01J 2237/24535* (2013.01); *H01J 2237/24542* (2013.01)

(58) Field of Classification Search
CPC ........ G01T 1/2921; G01T 1/29; H01J 37/252; H01J 37/3171; H01J 37/244; H01J 37/243; H01J 2237/24542; H01J 2237/245; H01J 2237/24535
USPC .................................................. 250/492.21
See application file for complete search history.

(56) References Cited

U.S. PATENT DOCUMENTS

| 6,791,094 B1* | 9/2004 | Olson ................. H01J 37/3171 250/397 |
| 7,202,483 B2 | 4/2007 | Olson et al. |
| 7,453,070 B2* | 11/2008 | Gupta ................... G01J 1/4257 427/523 |
| 7,875,860 B2 | 1/2011 | Koehn et al. |
| 8,035,087 B2 | 10/2011 | White |
| 8,168,941 B2 | 5/2012 | Farley et al. |
| 9,564,292 B2* | 2/2017 | Ido ..................... H01J 37/3171 |

(Continued)

FOREIGN PATENT DOCUMENTS

| CN | 101167153 A | 4/2008 |
| CN | 101189698 A | 5/2008 |

(Continued)

*Primary Examiner* — Kiet T Nguyen
(74) *Attorney, Agent, or Firm* — TraskBritt

(57) ABSTRACT

An ion beam profiling system include a beam profiling element, an ion sensitive element electrically isolated from the beam profiling element, an ion source configured to emit an ion beam at the beam profiling element and the ion sensitive element, and a current measuring device coupled to the ion sensitive element. The beam profiling element includes a plate of material having two parallel major surfaces, a first slit aperture extending through the plate of material and having a first longitudinal length extending in a direction parallel to the two parallel major surfaces, and a second slit aperture extending through the plate of material and having a second longitudinal length extending in a direction parallel to the two parallel major surfaces, wherein the first longitudinal length of the first slit aperture is perpendicular to the second longitudinal length of the second slit aperture.

22 Claims, 7 Drawing Sheets

(56) References Cited

U.S. PATENT DOCUMENTS

| | | |
|---|---|---|
| 9,905,394 B1 | 2/2018 | Bhattiprolu et al. |
| 2012/0326028 A1 | 12/2012 | Muto et al. |
| 2018/0025898 A1 | 1/2018 | Grothe, Jr. |

FOREIGN PATENT DOCUMENTS

| | | |
|---|---|---|
| CN | 101675494 A | 3/2010 |
| CN | 101900826 A | 12/2010 |
| CN | 102115874 A | 7/2011 |

\* cited by examiner

ION BEAM PROFILING SYSTEM AND RELATED METHODS

GOVERNMENT RIGHTS

This invention was made with government support under Contract No. DE-AC07-05-ID14517 awarded by the United States Department of Energy. The government has certain rights in the invention.

TECHNICAL FIELD

Embodiments of the disclosure relate generally to an ion beam profiling system for profiling ion beams and related systems and methods.

BACKGROUND

Ion beams are used in research as well as production to modify materials. Precise characterization of the ion beam size and intensity is significant in relating ion beam damage to material response. Methods currently exist for measuring and characterizing ion beams; however, conventional methods are typically overly complicated, require a large physical footprint, and require costly manipulators with multiple degrees of motion to function.

BRIEF SUMMARY

Embodiments of the disclosure may include an ion beam profiling system. The ion beam profiling system may include a beam profiling element, an ion sensitive element electrically isolated from the beam profiling element, an ion source configured to emit an ion beam at the beam profiling element and the ion sensitive element, and a current measuring device coupled to the ion sensitive element. The beam profiling element may include a plate of material have two parallel major surfaces, a first slit aperture extending through the plate of material and having a first longitudinal length extending in a direction parallel to the two parallel major surfaces, and a second slit aperture extending through the plate of material and having a second longitudinal length extending in a direction parallel to the two parallel major surfaces, wherein the first longitudinal length of the first slit aperture is perpendicular to the second longitudinal length of the second slit aperture.

Embodiments of the disclosure include a method for profiling an ion beam. The method may include emitting an ion beam at a beam profiling element and an ion sensitive element, causing at least the beam profiling element to translate relative to the ion beam in a first direction, causing the ion beam to pass over a first slit aperture extending through the beam profiling element and having a first longitudinal length extending in a direction parallel to a major surface of the beam profiling element, causing the ion beam to pass over a second slit aperture extending through the beam profiling element and having a second longitudinal length extending in a direction parallel to the major surface of the beam profiling element, wherein the second longitudinal length of the second slit aperture is perpendicular to the first longitudinal length of the first slit aperture, measuring current generated in the ion sensitive element while the ion beam passes over the first slit aperture of the beam profiling element, measuring current generated in the ion sensitive element while the ion beam passes over the second slit aperture of the beam profiling element, and reconstructing a two-dimensional profile of the ion beam based at least partially on the current measured while the ion beam passes over the first slit aperture and the second slit aperture.

Embodiments of the disclosure may include an ion beam profiling system. The ion beam profiling system may include a beam profiling element and an ion source configured to emit an ion beam at the beam profiling element. The beam profiling element may include a first profiling element having a first longitudinal axis and a second profiling element having a second longitudinal axis, wherein the first longitudinal axis of the first profiling element is perpendicular to the second longitudinal axis of the second profiling element.

DETAILED DESCRIPTION

Figure 1:
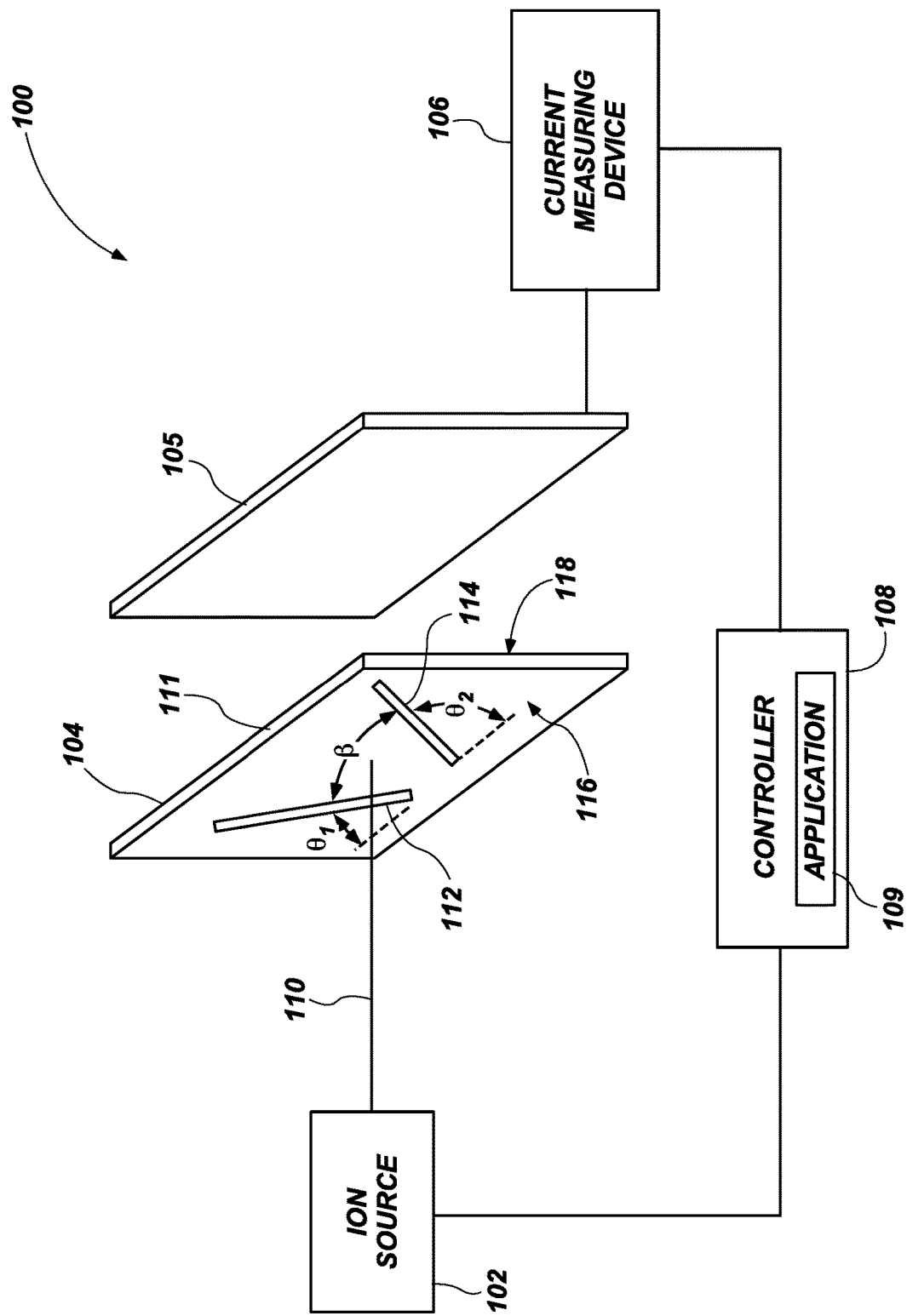
FIG. 1 is a schematic view of an ion beam profiling system according to one or more embodiments of the disclosure.

The illustrations presented herein are not actual views of any ion beam profiling system but are merely idealized representations employed to describe example embodiments of the disclosure. The following description provides specific details of embodiments of the disclosure in order to provide a thorough description thereof. However, a person of ordinary skill in the art will understand that the embodiments of the disclosure may be practiced without employing many such specific details. Indeed, the embodiments of the disclosure may be practiced in conjunction with conventional techniques employed in the industry. In addition, the description provided below does not include all elements to form a complete structure or assembly. Only those process acts and structures necessary to understand the embodiments of the disclosure are described in detail below. Additional conventional acts and structures may be used. Also note, any drawings accompanying the application are for illustrative purposes only, and are thus not drawn to scale. Additionally, elements common between figures may have corresponding numerical designations.

As used herein, the terms "comprising," "including," and grammatical equivalents thereof are inclusive or open-ended terms that do not exclude additional, un-recited elements or method steps, but also include the more restrictive terms "consisting of," "consisting essentially of," and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, the term "configured" refers to a size, shape, material composition, and arrangement of one or more of at least one structure and at least one apparatus facilitating operation of one or more of the structure and the apparatus in a predetermined way.

As used herein, the term "about" used in reference to a given parameter is inclusive of the stated value and has the meaning dictated by the context (e.g., it includes the degree of error associated with measurement of the given parameter, as well as variations resulting from manufacturing tolerances, etc.).

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the terms "ion beam profile" or "profile of an ion beam" may refer to a two-dimensional (2D) cross-section of the ion beam with the intensity (e.g., quantity of charged ions crossing an area of the cross-section per unit time) of the ion beam represented throughout the 2D cross-section. As a result, a distribution of the intensity of the ion beam, a position of the ion beam, and a size of the ion beam are also represented.

Embodiments of the disclosure include an ion beam profiling system that reconstructs a two-dimensional (2D) profile of an ion beam's intensity while requiring only a single degree of motion and a single measurement device. The ion beam profiling system may include at least two profiling elements (e.g., detector elements) that extend in directions perpendicular to each other and form about a 45° with the single degree of motion. Based on current measurements profiled by the at least two profiling elements, the ion beam profiling system may reconstruct a 2D profile of the ion beam.

The ion beam profiling system of embodiments of the disclosure may provide advantages over conventional profiling systems. For example, in comparison to conventional profiling systems, which typically require multiple degrees of motion and/or multiple measuring devices and/or ion-sensitive elements, the ion beam profiling system of the disclosure requires only a single degree of motion and a single ion-sensitive element and measurement device. As a result, the ion beam profiling system of the disclosure may be usable and viable in smaller vacuum chambers than conventional profiling systems. Accordingly, the ion beam profiling system of the disclosure may be more versatile than conventional profiling systems.

Moreover, because the ion beam profiling system of embodiments of the disclosure requires only a single degree of motion, the ion beam profiling system may provide a faster method for profiling a given ion beam in comparison to conventional profiling systems. Likewise, because the present ion beam profiling system requires only a single degree of motion and a single ion-sensitive element and/or measurement device, the ion beam profiling system may be less expensive to produce, which may lead to decreased costs and increased revenue. Furthermore, because the ion beam profiling system requires only a single degree of motion and a single ion-sensitive element and/or measurement device, the ion beam profiling system of the disclosure may have fewer potential failure points than conventional profiling systems, which may lead to a more reliable profiling system and longer lifespans than conventional profiling systems. Moreover, because the ion beam profiling system requires only a single degree of motion and a single ion-sensitive element and/or measurement device, the ion beam profiling system of the disclosure may be easier to use and may provide a more enjoyable user experience to an operator in comparison to conventional profiling systems.

FIG. 1 shows an ion beam profiling system 100 for profiling an ion beam (i.e., determining a profile of the ion beam) according to embodiments of the disclosure. The ion beam profiling system 100 may include an ion source 102, a beam profiling element 104, an ion-sensitive element 105, a current measuring device 106, and a controller 108. In some embodiments, an entirety of the ion beam profiling system 100 may be disposed within a vacuum (e.g., a relatively high or ultra-high vacuum).

The beam profiling element 104 may be disposed between the ion source 102 and the ion-sensitive element 105, and as is discussed below, the beam profiling element 104 may obstruct some portions of the an ion beam 110 from reaching the ion-sensitive element 105 and permitting other portions of the ion beam 110 to reach the ion-sensitive element 105. In other words, the beam profiling element 104 may filter which portions of the ion beam 110 are permitted to reach and impact the ion-sensitive element 105.

The ion source 102 may include a particle accelerator such as, for example, an electron beam ion source, an electron gun, a plasma-based device, a magnetron, a Penning source, an ion gun, a duoplasmatron ion source, a cold cathode, a charged molecular cluster source, or an electron cyclotron resonance ion source. Furthermore, the ion source 102 may be configured to emit the ion beam 110 as a stream of charged particles or ions. In some embodiments, the ion source 102 and/or the ion beam profiling system 100 may further include one or more beam steering optics utilizing magnetic and/or electric fields from steering the ion beam 110 along a beam path.

The beam profiling element 104 may include a plate of material 111, a first slit aperture 112, and a second slit aperture 114. The first and second slit apertures 112, 114 may extend through the plate of material 111. The plate of material 111 may further include two parallel major surfaces (e.g., a first major surface 116 and a second major surface 118) to which a path of the ion beam 110 emitted by ion source 102 is normal. Furthermore, each of the first and second slit apertures 112, 114 may extend from a first major surface 116 of the plate of material 111 to a second major surface 118 of the plate of material 111.

Each of the first and second slit apertures 112, 114 may include an elongated slit having a longitudinal length $L_1$, $L_2$ extending in direction parallel to the first and second major surfaces 116, 118. In some embodiments, the longitudinal length $L_1$ of the first slit aperture 112 and the longitudinal length $L_2$ of the second slit aperture 114 may define an angle $\beta$ there between. In one or more embodiments, the angle $\beta$ may be about 90°. In other words, the longitudinal length $L_1$ of the first slit aperture 112 may be perpendicular to the longitudinal length $L_2$ of the second slit aperture 114. In some embodiments, the angle $\beta$ may be about 30°, 45°, 60°, or any other compliment of angles. Furthermore, as is described in greater detail, the longitudinal length $L_1$ of the first slit aperture 112 and the longitudinal length $L_2$ of the second slit aperture 114 may extend in directions forming acute angles $\theta_1$, $\theta_2$ with a direction of motion (FIG. 3) of the beam profiling element 104 when profiling the ion beam 110. In some embodiments, each of the acute angles $\theta_1$, $\theta_2$ may be about 45°. Additionally, each of the longitudinal length $L_1$ of the first slit aperture 112 and the longitudinal length $L_2$ of the second slit aperture 114 may be longer than an anticipated diameter of the ion beam 110 emitted by the ion source 102. As is discussed in greater detail below in regard to FIGS. 2 and 3, each of the first and second slit apertures 112, 114 may permit an entirety of a cross-section of the ion beam 110 to pass through the respective slit incrementally and portion by portion over a period of time. Furthermore, the directions across the cross-section of the ion beam 110 in which the ion beam 110 is incrementally passed through the first and second slit apertures 112, 114 are perpendicular to each other, which ultimately minimalizes overlap of current measurements between first and second slit apertures 112, 114 within the ion-sensitive element 105 and results in accurate measurements for profiling the ion beam 110.

Each of the first and second slit apertures 112, 114 may have a width W (i.e., a distance between surfaces defining the first and second slit apertures 112, 114). In some embodiments, the width W of the first and second slit apertures 112, 114 is selected based at least partially on the diameter of the ion beam 110. For instance, for relatively larger ion beams, the width W of the first and second slit apertures 112, 114 may be larger up to a threshold width, and for relatively smaller ion beams, the width W of the first and second slit apertures 112, 114 may be smaller down to another threshold width. Furthermore, the width W of the first and second slit apertures 112, 114 may be selected to avoid electro-static charging between the surfaces defining the first and second slit apertures 112, 114. In some embodiments, the width W of the first and second slit apertures 112, 114 may be within a range of about 0.010 inch and about 0.5 inch; however, the disclosure is not so limited, and the width W of the first and second slit apertures 112, 114 may be any value to accommodate a given ion beam.

In some embodiments, the beam profiling element 104 may include a conductive material (e.g., electrically conductive). For example, the beam profiling element 104 may include one or more of copper, steel, aluminum, tungsten, gold, silver, nickel, zinc, brass, an alloy of any of the foregoing metals, or any other conductive material suitable for relatively high vacuum environment.

Referring still to FIG. 1, the ion-sensitive element 105 may be oriented on an opposite side of the beam profiling element 104 than the ion source 102 and may be configured to be exposed to portions of the ion beam 110 not obstructed (i.e., blocked and/or absorbed) by the beam profiling element 104. The ion-sensitive element 105 may be electrically isolated from the beam profiling element 104. The ion-sensitive element 105 may further be operably coupled to the current measuring device 106 and there through the controller 108. In some embodiments, the ion-sensitive element 105 may include a conductive plate configured to capture charge particles (i.e., ions) of the ion beam 110. In particular, when the ion beam 110 impacts ("hits") the ion-sensitive element 105, the ion-sensitive element 105 neutralizes (e.g., absorbs) the charged particles of the ion beam 110 and gains a net charge. Furthermore, the ion-sensitive element 105 can be discharged via the current measuring device 106, and the current measuring device 106 may measure a resulting current (i.e., a current resulting from the ion beam 110 impacting the ion-sensitive element 105). The resulting current may be proportional to a number (e.g., an amount) of impinging ions on the ion-sensitive element 105. In some embodiments, the current cause by the ion beam 110 may be measured via conventional methods.

The ion-sensitive element 105 may include any conductive material. For example, the ion-sensitive element 105 may include one or more of copper, steel, stainless steel, titanium, tungsten, molybdenum, gold, platinum, nickel, an alloy of any of the foregoing metals, or any other conductive material suitable for relatively high vacuum environment. As a non-limiting example, the ion-sensitive element 105 may include tungsten. In some embodiments, the beam profiling element 104 and the ion-sensitive element 105 may include a same material.

In some embodiments, the current measuring device 106 may include an ammeter. For example, the current measuring device 106 may include a picoammeter. Furthermore, the current measuring device 106 may include any conventional device for measuring current.

The controller 108 may be operably coupled to one or more of the ion source 102, the beam profiling element 104, the ion-sensitive element 105, or the current measuring device 106. As is discussed in greater detail below, the controller 108 may be configured to cause the ion source 102 to emit the ion beam 110, cause the beam profiling element 104 or the beam profiling element 104 and the ion-sensitive element 105 to translate (e.g., move) relative to the ion beam 110, cause the current measuring device 106 to measure a current in the ion-sensitive element 105, and receive current measurements from the current measuring device 106. Furthermore, the controller 108 may be configured to generate a profile the ion beam 110 based at least partially on the received current measurements associated with the first and second slit apertures 112, 114. For example, the controller 108 may include a profiling application 109 for determining a 2D profile of the ion beam 110 from the received current measurements. In some embodiments, the profiling application 109 may further generate three dimensional images/models representing the determined profile of the ion beam 110.

The controller 108 of the ion beam profiling system 100 may represent various types of computing devices with which operators (e.g., testers) can interact. For example, the controller 108 may include any computing device. In some embodiments, the controller 108 may be native to the ion beam profiling system 100. For instance, the controller 108 may be internal to the ion beam profiling system 100. In other embodiments, the controller 108 may be separate and distinct from other portions of the ion beam profiling system 100 and may be operably coupled to the other portions of ion beam profiling system 100. For example, the controller 108 may include a desktop computer and/or server. In additional embodiments, the controller 108 may include a mobile device (e.g., a cell phone, a smartphone, a PDA, a tablet, a laptop, etc.). The controller 108 is described in further detail in regard to FIG. 8.

Referring still to FIG. 1, the ion beam profiling system 100 may further include any associated support structure (e.g., plates, fasteners, apertures, support members) for supporting the various elements of the ion beam profiling system 100 described herein.

Additionally, in some embodiments, the beam profiling element 104 may also be coupled to a current measuring device, and a current generated in the beam profiling element 104 may also be measured by the controller 108. Furthermore, the current generated in the beam profiling element 104 may be used to at least partially validate a profile of the ion beam 110 reconstructed by the ion beam profiling system 100, as is discussed in greater detail below in regard to FIGS. 2 and 3.

Figure 2:
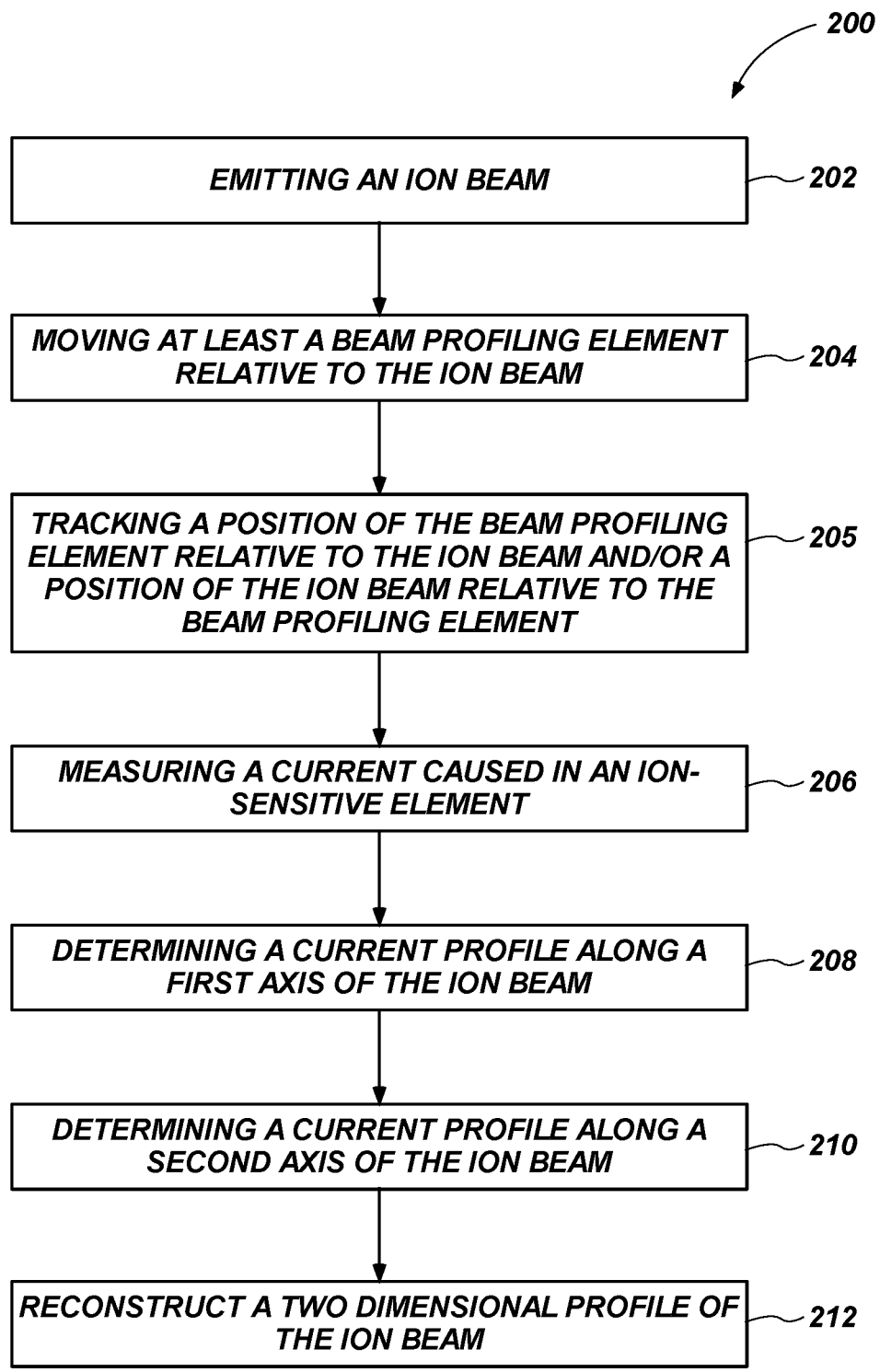
FIG. 2 is a flowchart of a method of profiling an ion beam according to one or more embodiments of the disclosure.
Figure 3:
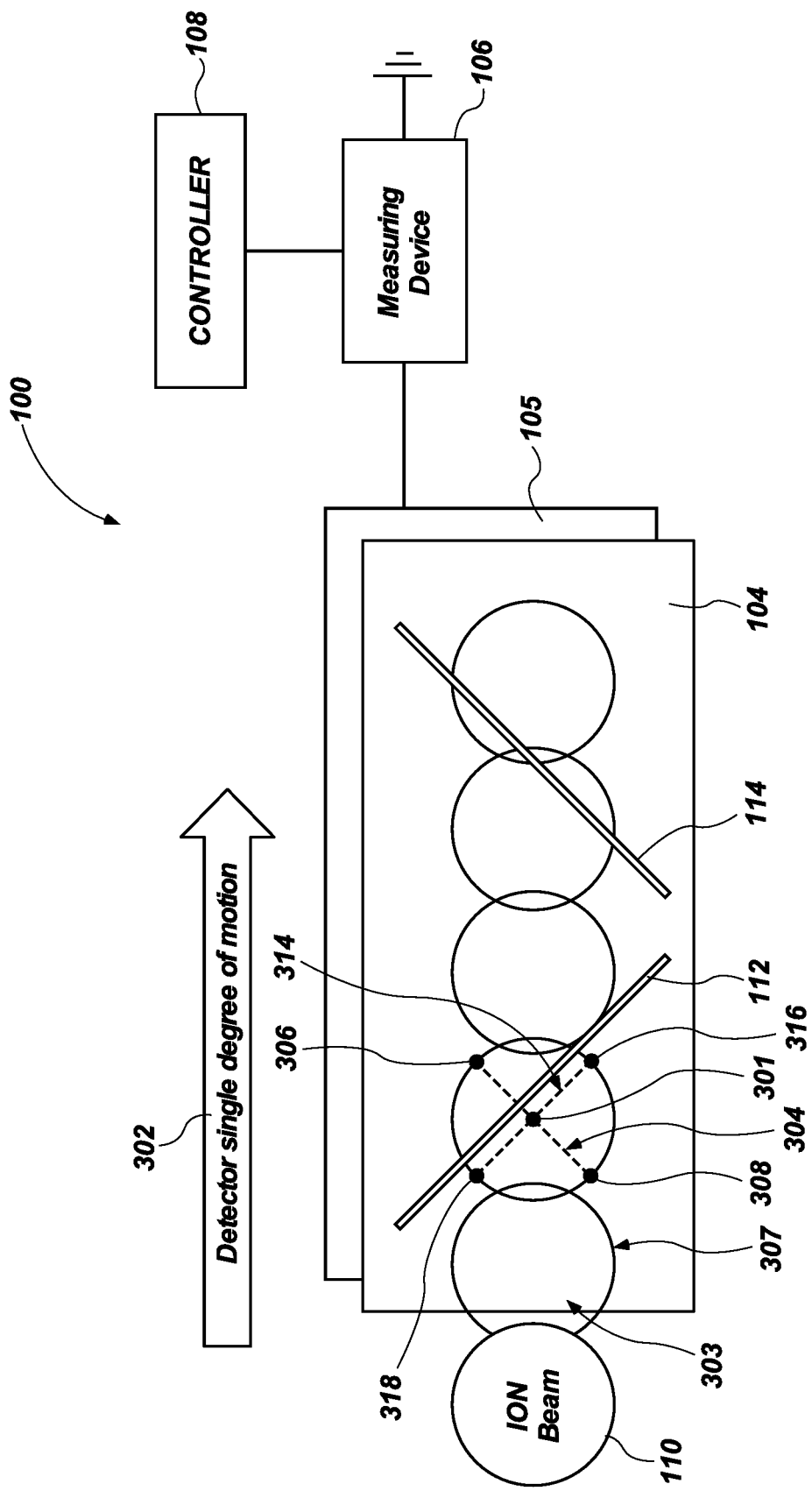
FIG. 3 is a schematic view of the ion beam profiling system of FIG. 1 according to one or more embodiments of the disclosure.

FIG. 2 shows a schematic flow chart of a method 200 of profiling an ion beam according to embodiments of the disclosure. FIG. 3 is a schematic view of the ion beam profiling system 100 and the path of an ion beam during the method 200 of FIG. 2. Referring to FIGS. 2 and 3 together, the method 200 may include emitting an ion beam (e.g., ion beam 110) with the ion source 102 at the beam profiling element 104 and the ion-sensitive element 105, as shown in act 202 of FIG. 2. For example, the controller 108 may cause the ion source 102 to emit an ion beam 110 at the beam profiling element 104 and the ion-sensitive element 105. The ion source 102 may include any of the ion sources described above in regard to FIG. 1, and the ion beam 110 may include any of the ion beams described above in regard to FIG. 1.

Responsive to emitting the ion beam 110 at the beam profiling element 104 and the ion-sensitive element 105, the method 200 may include moving at least the beam profiling element 104 relative to the ion beam 110, as shown in act 204 of FIG. 2. For example, the controller 108 may cause the beam profiling element 104 to translate in a direction perpendicular to the ion beam 110 and such that the ion beam 110 passes over both the first slit aperture 112 and the second slit aperture 114. For instance, the controller 108 may cause the beam profiling element 104 to translate in the direction 302 depicted in FIG. 3. In some embodiments, the controller 108 may cause at least the beam profiling element 104 to move via one or more actuators and/or solenoids and associated systems.

In one or more embodiments, moving at least the beam profiling element 104 relative to the ion beam 110 may include moving only the beam profiling element 104 relative to the ion beam 110 and leaving the ion-sensitive element 105 stationary. In alternative embodiments, moving at least the beam profiling element 104 relative to the ion beam 110 may include moving both the beam profiling element 104 and the ion-sensitive element 105 relative to the ion beam 110.

In some embodiments, the controller 108 may cause at least the beam profiling element 104 to translate relative to the ion beam 110 according to a selected speed and/or rate. For instance, the controller 108 may cause at least the beam profiling element 104 to translate relative to the ion beam 110 at a speed of about 0.1 mm/sec and about 10 mm/sec. As a non-limiting example, the controller 108 may cause at least the beam profiling element 104 to translate relative to the ion beam 110 at a speed of about 1 mm/sec.

As noted above, causing the beam profiling element 104 to translate relative to the ion beam 110 may cause the ion beam 110 to pass over both the first slit aperture 112 and then the second slit aperture 114. Passing the ion beam 110 over both the first slit aperture 112 and then the second slit aperture 114 will cause a portions (e.g., slices) of the ion beam 110 to incrementally pass through the first slit aperture 112 and second slit aperture 114 of the beam profiling element 104, when passing over the first slit aperture 112 and second slit aperture 114, and to impact ("hit") the ion-sensitive element 105.

When passing the ion beam 110 over the first slit aperture 112, an entirety of a cross-section 303 of the ion beam 110 may eventually pass through the first slit aperture 112, incrementally and portion by portion, along a first axis 304. For example, the cross-section 303 of the ion beam 110 may begin to intersect with the first slit aperture 112 at a first point 306 on an outer peripheral edge 307 of the cross-section 303 of the ion beam 110 and may finish intersecting with the outer peripheral edge 307 of the cross-section 303 of the ion beam 110 at a second point 308. A line extending from the first point 306 to the second point 308 may define the first axis 304. The first axis 304 may be at least substantially perpendicular to the longitudinal length $L_1$ of the first slit aperture 112.

Additionally, when passing over the first slit aperture 112 and through the first slit aperture 112, the ion beam 110 may begin passing through the first slit aperture 112 at the first point 306 on the outer peripheral edge 307 of the cross-section 303 of the ion beam 110, and an amount (e.g., and amount of the cross-section 303) of the ion beam 110 passing through the first slit aperture 112 may increase as the ion beam 110 passes over the first slit aperture 112 until the first slit aperture 112 reaches a center 301 of the ion beam 110 and first slit aperture 112 is spanning a full diameter of the ion beam 110. Upon reaching the center 301 of the ion beam 110, an amount (e.g., and amount of the cross-section 303) of the ion beam 110 passing through the first slit aperture 112 may decrease as the ion beam 110 passes over the first slit aperture 112 until the first slit aperture 112 reaches the second point 308 on the outer peripheral edge 307 of the cross-section 303 of the ion beam 110.

Conversely, when passing the ion beam 110 over the second slit aperture 114, an entirety of the cross-section 303 of the ion beam 110 may eventually pass through the second slit aperture 114, incrementally and portion by portion, along a second axis 314. Furthermore, the second axis 314 may be perpendicular to the first axis 304. The cross-section 303 of the ion beam 110 may begin to intersect with the second slit aperture 114 at a third point 316 on the outer peripheral edge 307 of the cross-section 303 of the ion beam 110 and may finish intersecting with the outer peripheral edge 307 of the cross-section 303 of the ion beam 110 at a fourth point 318. A line extending from the third point 316 to the fourth point 318 may define the second axis 314. The second axis 314 may be at least substantially perpendicular to the longitudinal length $L_2$ of the second slit aperture 114.

Furthermore, when passing over the second slit aperture 114 and through the second slit aperture 114, the ion beam 110 may begin passing through the second slit aperture 114 at the third point 316 on the outer peripheral edge 307 of the cross-section 303 of the ion beam 110, and an amount (e.g., and amount of the cross-section 303) of the ion beam 110 passing through the second slit aperture 114 may increase as the ion beam 110 passes over the second slit aperture 114 until the second slit aperture 114 reaches the center 301 of the ion beam 110 and second slit aperture 114 is spanning a full diameter of the ion beam 110. Upon reaching the center 301 of the ion beam 110, an amount (e.g., and amount of the cross-section 303) of the ion beam 110 passing through the second slit aperture 114 may decrease as the ion beam 110 passes over the second slit aperture 114 until the second slit aperture 114 reaches the fourth point 318 on the outer peripheral edge 307 of the cross-section 303 of the ion beam 110.

In some embodiments, the first point 306 on the outer peripheral edge 307 of the cross-section 303 of the ion beam 110 may be vertically aligned with the third point 316 on the outer peripheral edge 307 of the cross-section 303 of the ion beam 110. Likewise, the second point 308 on the outer peripheral edge 307 of the cross-section 303 of the ion beam 110 may be vertically aligned with the fourth point 318 on the outer peripheral edge 307 of the cross-section 303 of the ion beam 110. Additionally, the first point 306 on the outer peripheral edge 307 of the cross-section 303 of the ion beam 110 may be horizontally aligned with the fourth point 318 on the outer peripheral edge 307 of the cross-section 303 of the ion beam 110. Moreover, the third point 316 on the outer peripheral edge 307 of the cross-section 303 of the ion beam 110 may be horizontally aligned with the second point 308 on the outer peripheral edge 307 of the cross-section 303 of the ion beam 110.

In view of the foregoing, because the first axis 304 is perpendicular to the second axis 314, passing the ion beam 110 over the first slit aperture 112 and then over the second slit aperture 114 results in the full cross-section 303 of the ion beam 110 being passed through the beam profiling element 104 two times while minimizing overlapping data between each pass. In other words, the portions (e.g., slices) of the cross-section 303 of the ion beam 110 passed through the first slit aperture 112 do not match the portions (e.g., slices) of the cross-section 303 of the ion beam 110 passed through the second slit aperture 114.

In some embodiments, the method 200 may further include tracking a position of the beam profiling element 104 relative to the ion beam 110 and/or the position of the ion beam 110 relative to the ion beam profiling element 104, as shown in act 205 of FIG. 2. In some embodiments, the position of the beam profiling element 104 relative to a static object may be tracked; for instance, the position of the beam profiling element 104 may be known throughout the processes and methods described herein. Furthermore, by tracking the position of the beam profiling element 104, a position of the ion beam 110 may be determined and/or known relative to the static object. In some embodiments, the static object may include the ion-sensitive element 105. In additional embodiments, the static object may include a portion of a structure to which a motor is mounted for moving the beam profiling element 104 relative to the structure. As will be discussed in greater detail below, profiling the ion beam 110 within the beam profiling element 104 may produce two peaks of current measured by the current measuring device 106, and a vertical position of the ion beam 110 may be determined by measuring a distance between the two peaks. The horizontal position of the ion beam 110 may be determined by a distance from an x=0 position to a first peak centroid. Additionally, tracking relative positions may be achieved via any conventional methods.

Figure 4:
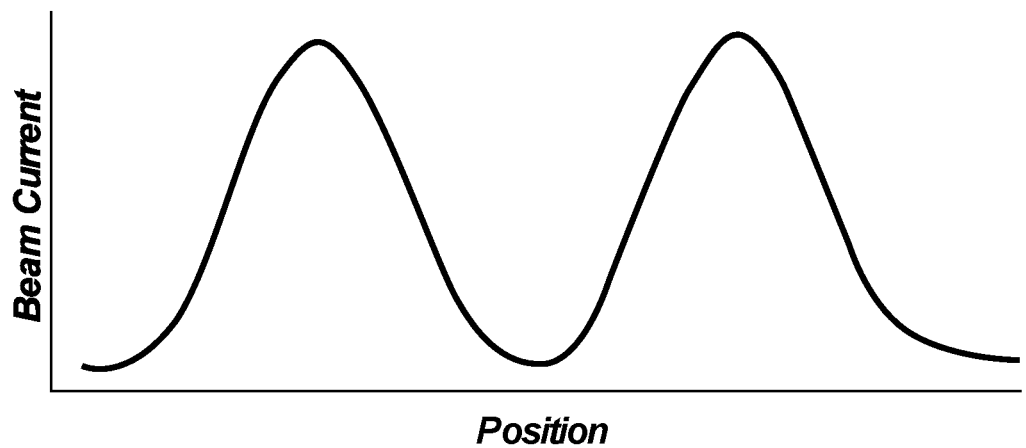
FIG. 4 is a chart showing a measured current against a tracked position of ion beam relative to a beam profiling element of the ion beam profiling system of FIG. 1 according to one or more embodiments of the disclosure.

Referring still to FIGS. 1-3 together, the method 200 may include measuring a current caused in the ion-sensitive element 105 by the ion beam 110 impacting the ion-sensitive element 105 while the ion beam 110 is passed over the first and second slit apertures 112, 114, as shown in act 206 of FIG. 2. Responsive to the ion beam 110 impacting the ion-sensitive element 105, the ion-sensitive element 105 may produce a current via any of the manners described above in regard to FIG. 1 and in response to neutralizing charged particles of the ion beam 110. Furthermore, the controller 108 may cause the current measuring device 106 to measure a current exhibited by the ion-sensitive element 105. In some embodiments, measuring a current caused in the ion-sensitive element 105 by the ion beam 110 may include continuously measuring a current caused in the ion-sensitive element 105 throughout a time period of the ion beam 110 passing over the first slit aperture 112 and the second slit aperture 114 of the beam profiling element 104. FIG. 4 depicts an example measured current against a position of the ion beam 110 relative to the beam profiling element. Referring to FIGS. 1-4 together, as an amount of ion beam 110 passing through first and second slit apertures 112, 114 increases, the amount of measured current increases, and as an amount of the ion beam 110 passing through first and second slit apertures 112, 114 decreases, the amount of measured current decreases.

Additionally, the method 200 may include, based at least partially on the measured current, determining a current profile of the ion beam 110 along the first axis 304 of the ion beam 110, as shown in act 208 of FIG. 2. For example, the controller 108, via the application 109 may determine the current profile of the ion beam 110 along the first axis 304 utilizing the measured current obtained while the ion beam 110 passes over the first slit aperture 112 and a known position of the ion beam 110 relative to the beam profiling element 104. In some embodiments, upon obtaining the measure currents, the application 109 of the controller 108 may use any conventional methods to determine a current profile of the ion beam 110 along the first axis 304 based on the measured currents. In some embodiments, the current profile along the first axis 304 may generally represent a profile of the ion beam 110 along the first axis 304.

Additionally, the method 200 may include, based at least partially on the measured current, determining a current profile of the ion beam 110 along the second axis 314 of the ion beam 110, as shown in act 210 of FIG. 2. For example, the controller 108, via the application 109 may determine the current profile of the ion beam 110 along the second axis 314 utilizing the measured current obtained while the ion beam 110 passes over the second slit aperture 114 and a known position of the ion beam 110 relative to the beam profiling element 104. In some embodiments, upon obtaining the measure currents, the application 109 of the controller 108 may use any conventional methods to determine a current profile of the ion beam 110 along the second axis 314 based on the measured currents. In some embodiments, the current profile along the second axis 314 may generally represent a profile of the ion beam 110 along the first axis 304.

Upon determining the current profile of the ion beam 110 along the first and second axes 304, 314, the method 200 may include generating (e.g., reconstructing) an overall 2D profile of the ion beam 110, as shown in act 212 of FIG. 2. For example, the method 200 may include reconstructing a 2D cross-section of the ion beam 110 with a distribution of the intensity (e.g., concentration of charged ions crossing that area of the cross-section per unit time) of the ion beam 110 represented within the 2D cross-section.

Figure 5:
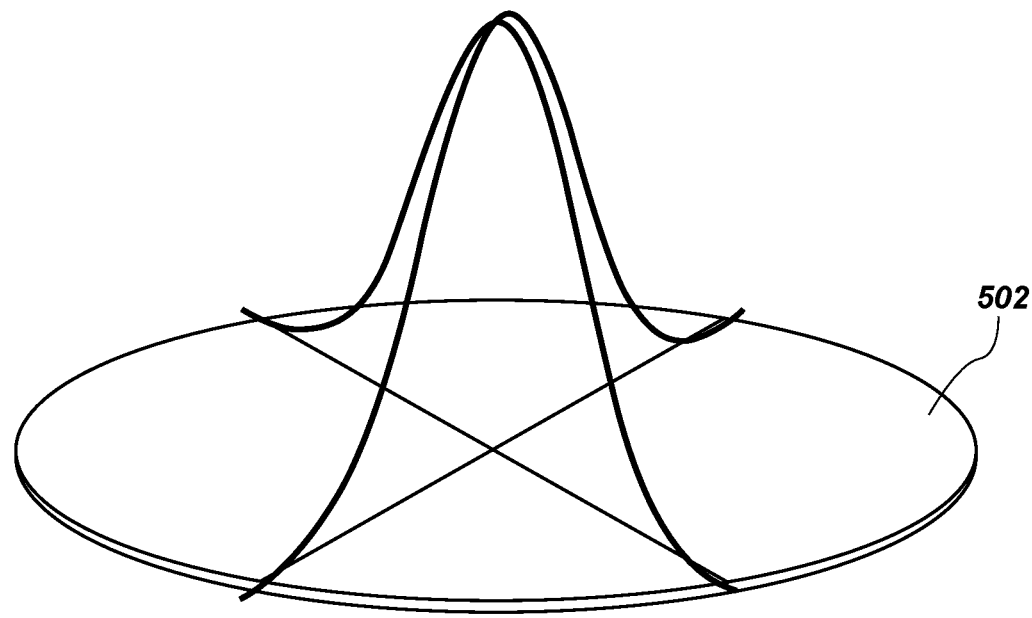
FIG. 5 is a schematic representation of an ion beam profile according to one or more embodiments of the disclosure.

FIG. 5 is a schematic representation of a reconstructed 2D profile 502 of an ion beam 110 according to one or more embodiments of the disclosure. In some embodiments, the controller 108, via the application 109, may reconstruct (e.g., generate) the profile of the ion beam 110 base at least partially on the current profile of the ion beam 110 along the first axis 304 and the current profile of the ion beam 110 along the second axis 314. For example, the application 109 of the controller 108 may determine ion beam intensity based on a level of current indicated in the current profiles and/or slopes and/or rates of change of current indicated in the current profiles. Additionally, the application 109 of the controller 108 may determine an absolute position of the ion beam 110 at any given point throughout the method.

In one or more embodiments, the application 109 of the controller 108 may interpolate and/or project data for portions of the ion beam 110 between the first and second axes 304, 314. In some embodiments, the application 109 of the controller 108 may further include one or more machine-learning processes in generating the 2D profile of the ion beam 110. For example, in some embodiments, the application 109 of the controller 108 may be programmed to analyze the measured currents along the first and second axes 304, 314 utilizing one or more of regression models (e.g., a set of statistical processes for estimating the relationships among variables), classification models, and/or phenomena models. Additionally, the machine-learning models may include a quadratic regression analysis, a logistic regression analysis, a support vector machine, a Gaussian process regression, ensemble models, or any other regression analysis. Furthermore, in yet further embodiments, the machine-learning models may include decision tree learning, regression trees, boosted trees, gradient boosted tree, multilayer perceptron, one-vs-rest, Naïve Bayes, k-nearest neighbor, association rule learning, a neural network, deep learning, pattern recognition, or any other type of machine-learning.

In some embodiments, the method 200 may further include generating three-dimensional representations of the profile 502 of the ion beam 110, as depicted in FIG. 5. Furthermore, position, alignment, intensity and potential skewing of the ion beam 110 can be assessed based on the determined profile 502 of the ion beam 110.

Referring to FIGS. 1-5 together, the ion beam profiling system 100 may provide advantages over conventional profiling systems. For example, in comparison to conventional profiling systems, which typically require multiple degrees of motion and/or multiple measuring devices and/or ion-sensitive elements, the ion beam profiling system 100 of the disclosure requires only a single degree of motion (e.g., the movement of the beam profiling element 104) and a single ion-sensitive element and measurement device. As a result, the ion beam profiling system 100 of the disclosure may be usable and viable in smaller vacuum chambers than conventional profiling systems. Accordingly, the ion beam profiling system 100 of the disclosure may be more versatile than conventional profiling systems.

Moreover, because the ion beam profiling system 100 requires only a single degree of motion (e.g., the movement of the beam profiling element 104), the ion beam profiling system 100 may provide a faster method for profiling a given ion beam in comparison to conventional profiling systems. Likewise, because the ion beam profiling system 100 requires only a single degree of motion (e.g., the movement of the beam profiling element 104) and a single ion-sensitive element and/or measurement device, the ion beam profiling system 100 may be less expensive to produce, which may lead to decreased costs and increased revenue. Furthermore, because the ion beam profiling system 100 requires only a single degree of motion (e.g., the movement of the beam profiling element 104) and a single ion-sensitive element and/or measurement device, the ion beam profiling system 100 of the disclosure may have fewer potential failure points than conventional profiling systems, which may lead to a more reliable profiling system and longer lifespans than conventional profiling systems. Moreover, because the ion beam profiling system 100 requires only a single degree of motion (e.g., the movement of the beam profiling element 104) and a single ion-sensitive element and/or measurement device, the ion beam profiling system 100 of the disclosure may be easier to use and may provide a more enjoyable user experience to an operator in comparison to conventional profiling systems.

Figure 6:
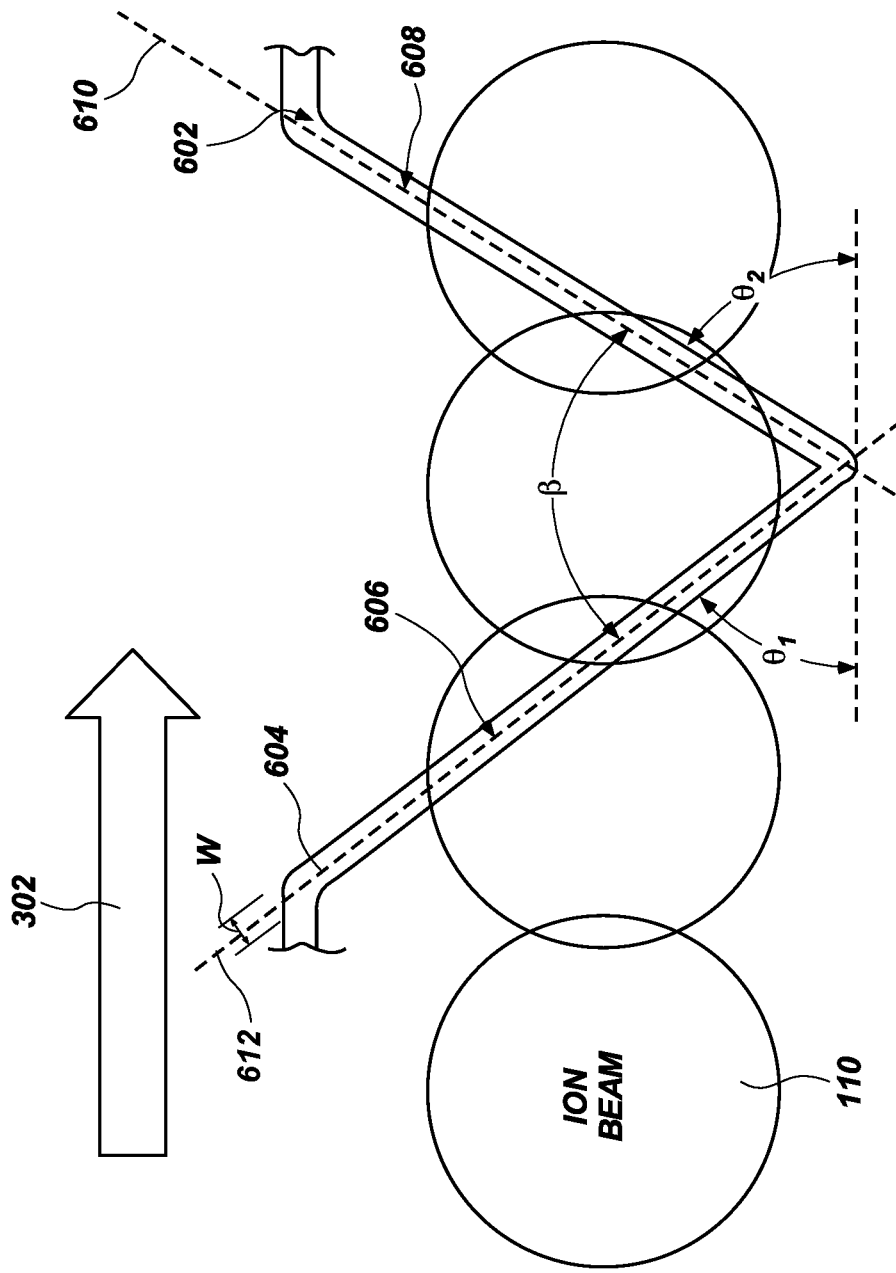
FIG. 6 is a schematic view of an ion-sensitive profiling element that can be utilized in the ion beam profiling system according to one or more embodiments of the disclosure.

FIG. 6 shows a combination of a beam profiling element and an ion-sensitive element (referred to herein as an "ion-sensitive profiling element 602") of an ion profiling system (e.g., ion beam profiling system 100) according to one or more embodiments of the disclosure. The ion-sensitive profiling element 602 may be utilized with the ion beam profiling system 100 described above in regard to FIG. 1 and may replace the beam profiling element 104 and the ion-sensitive element 105 of the ion beam profiling system 100. The ion-sensitive profiling element 602 may be coupled to the current measuring device 106, and the controller 108 may move the ion-sensitive profiling element 602 via any of the manners described above in regard to FIGS. 1-5 and the beam profiling element 104 and the ion-sensitive element 105.

The ion-sensitive profiling element 602 may include an elongated member 604 (e.g., a wire, a rod, a strand, a line) of a conductive material. The elongated member 604 may include a first profiling element 606 and a second profiling element 608. The first profiling element 606 may include a first linear portion of the elongated member 604, and the second profiling element 608 may include a second, different linear portion of the elongated member 604. Each of the first and second profiling elements 606, 608 may have respective longitudinal axes 610, 612.

In some embodiments, the longitudinal axis 610 of the first profiling element 606 and the longitudinal axis 612 of the second profiling element 608 may define the angle β there between. As noted above, in some embodiments, the angle β may be about 90°. In other words, the longitudinal axis 610 of the first profiling element 606 may be perpendicular to the longitudinal axis 612 of the second profiling element 608. In some embodiments, the angle β may be about 30°, 45°, 60°, or any other compliment of angles. Furthermore, the longitudinal axis 610 of the first profiling element 606 and the longitudinal axis 612 of the second profiling element 608 may extend in directions forming acute angles $\theta_1$, $\theta_2$ with a direction 302 of motion of the ion-sensitive profiling element 602 when profiling the ion beam 110. As noted, each of the acute angles $\theta_1$, $\theta_2$ may be about 45°. Additionally, each of the first profiling element 606 and the second profiling element 608 may be longer than an anticipated diameter of the ion beam 110 emitted by the ion source 102.

As is discussed in greater detail below, each of the first profiling element 606 and the second profiling element 608 may permit an entirety of a cross-section 303 of the ion beam 110 to pass over the respective profiling element incrementally and portion by portion over a period of time. Furthermore, the directions across the cross-section 303 of the ion beam 110 in which the ion beam 110 is incrementally passed through the first and second profiling elements 606, 608 are perpendicular to each other in a manner similar to the first and second slit apertures 112, 114 described above in regard to FIGS. 1-3, which ultimately minimizes overlap of current measurements between first and second profiling elements 606, 608 within the ion-sensitive profiling element 602 and results in accurate measurements for profiling the ion beam 110.

Each of the first and second profiling elements 606, 608 may have a width W. In some embodiments, the width W of the first and second profiling elements 606, 608 is selected based at least partially on the diameter of the ion beam 110. For instance, for relatively larger ion beams, the width W of the first and second profiling elements 606, 608 may be larger up to a threshold width, and for relatively smaller ion beams, the width W of the first and second profiling elements 606, 608 may be smaller down to another threshold width. In some embodiments, the width W of the first and second profiling elements 606, 608 may be within a range of about 0.010 inch and about 0.5 inch; however, the disclosure is not so limited, and the width W of first and second profiling elements 606, 608 may be any value to accommodate a given ion beam.

As noted above, the ion-sensitive profiling element 602 may include a conductive material. For example, the ion-sensitive profiling element 602 may include one or more of copper, steel, stainless steel, titanium, tungsten, molybdenum, gold, platinum, nickel, an alloy of any of the foregoing metals, or any other conductive material suitable for relatively high vacuum environment.

In some embodiments, the ion-sensitive profiling element 602 may have a sufficient height H, and the first and second profiling elements 606, 608 may have sufficient lengths relative to a diameter of the ion beam 110 to prevent the ion beam 110 from impacting both the first profiling element 606 and the second profiling element 608 at a same time. For instance, in operation, the ion beam 110 may pass completely over the first profiling element 606 before encountering the second profiling element 608.

Figure 7:
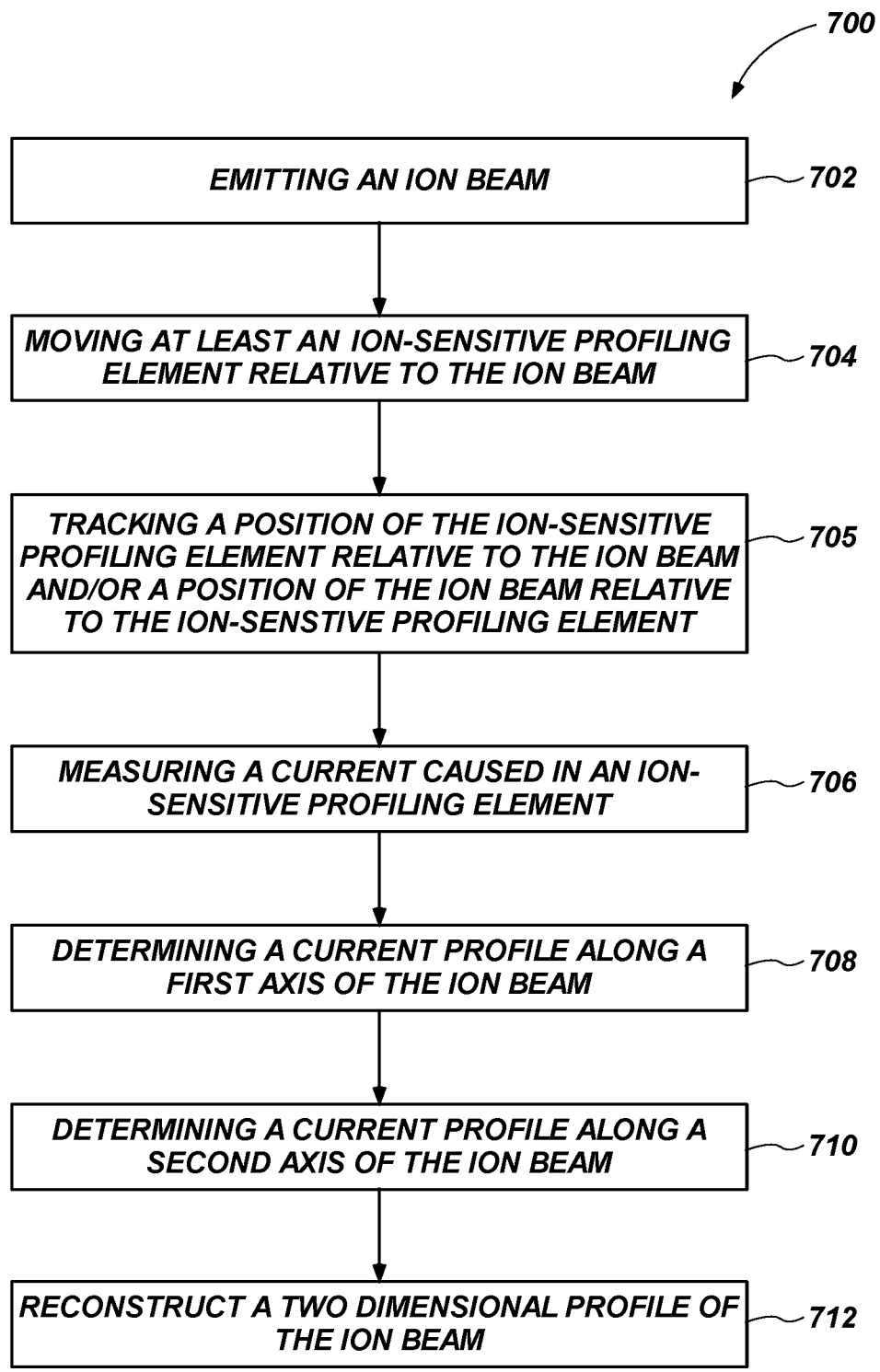
FIG. 7 is a flowchart of a method of profiling an ion beam according to one or more embodiments of the disclosure.

FIG. 7 shows a schematic flow chart of a method 700 of profiling an ion beam according to embodiments of the disclosure. Referring to FIGS. 6 and 7 together, in operation, an ion beam profiling system 100 utilizing the ion-sensitive profiling element 602 may operate in a manner similar to the manner described above in regard to FIGS. 1-5 above. For instance, the method 700 may include emitting an ion beam (e.g., ion beam 110) with the ion source 102 at the ion-sensitive profiling element 602, as shown in act 702 of FIG. 7. For example, the controller 108 may cause the ion source 102 to emit an ion beam 110 at the ion-sensitive profiling element 602 via any of manners described above in regard to act 202 of FIG. 2.

Responsive to emitting the ion beam 110 at the ion-sensitive profiling element 602, the method 700 may include moving at least the ion-sensitive profiling element 602 relative to the ion beam 110, as shown in act 704 of FIG. 7. For example, the controller 108 may cause the ion-sensitive profiling element 602 to translate in a direction 302 perpendicular to the ion beam 110 and such that the ion beam 110 passes over both the first and the second profiling elements 606, 608 via any of the manners described above in regard to act 204 of FIG. 2.

Passing the ion beam 110 over both the first and the second profiling elements 606, 608 will cause a portions (e.g., slices) of the ion beam 110 to incrementally impact ("hit") the ion-sensitive profiling element 602, when passing over the first and the second profiling elements 606, 608.

When passing the ion beam 110 over the first profiling element 606, an entirety of a cross-section 303 of the ion beam 110 may eventually impact the first profiling element 606, incrementally and portion by portion, along a first axis 304 in the same manner described above in regard to act 204 of FIG. 2.

Conversely, when passing the ion beam 110 over the second profiling element 608, an entirety of the cross-section 303 of the ion beam 110 may eventually impact the second profiling element 608, incrementally and portion by portion, along a second axis 314 in the same manner described above in regard to act 204 of FIG. 2.

In some embodiments, the method 700 may further include tracking a position of the ion-sensitive profiling element 602 relative to the ion beam 110 and/or the position of the ion beam 110 relative to the ion-sensitive profiling element 602, as shown in act 705 of FIG. 7. Tracking relative positions may be achieved via any conventional methods.

Referring still to FIGS. 1-3 together, the method 700 may include measuring a current caused in the ion-sensitive profiling element 602 by the ion beam 110 impacting the ion-sensitive profiling element 602 while the ion beam 110 is passed over the first and second profiling elements 606, 608, as shown in act 706 of FIG. 7. For instance, the method 700 may include measuring the current cause in the ion-sensitive profiling element 602 via any of the manners described above in regard to act 206 of FIG. 2.

Additionally, the method 700 may include, based at least partially on the measured current, determining a current profile of the ion beam 110 along the first axis 304 of the ion beam 110, as shown in act 708 of FIG. 7. For example, the method 700 may determining a current profile of the ion beam 110 along the first axis 304 of the ion beam 110 via any of the manners described above in regard to act 208 of FIG. 2.

Additionally, the method 200 may include, based at least partially on the measured current, determining a current profile of the ion beam 110 along the second axis 314 of the ion beam 110, as shown in act 710 of FIG. 2. For example, the method 700 may determining a current profile of the ion beam 110 along the second axis 314 of the ion beam 110 via any of the manners described above in regard to act 210 of FIG. 2.

Upon determining the current profile of the ion beam 110 along the first and second axes 304, 314, the method 700 may include generating (e.g., reconstructing) an overall 2D profile of the ion beam 110, as shown in act 712 of FIG. 7. For example, the method 700 may include reconstructing a 2D cross-section of the ion beam 110 with a distribution of the intensity (e.g., concentration of charged ions crossing that area of the cross-section per unit time) of the ion beam 110 represented within the 2D cross-section via any of the manners described above in regard to act 212 of FIG. 2.

Furthermore, the ion beam profiling system 100 described in regard to FIGS. 6 and 7 may provide the same advantages over conventional profiling systems described above in regard to FIGS. 1-5.

Referring still to FIGS. 1-7, in alternative embodiments, the ion-sensitive profiling element 602 described above in regard to FIG. 6 may serve as a beam profiling element of the ion beam profiling system 100, and the ion beam profiling system 100 may further include an ion-sensitive element (e.g., ion-sensitive element 105) electrically isolated from the ion-sensitive profiling element 602 and coupled to a current measuring device (e.g., current measuring device 106). In operation, an ion source (e.g., ion source 102) may emit an ion beam 110 at the ion-sensitive profiling element 602 and the ion-sensitive element (e.g., ion-sensitive element 105), and the ion-sensitive profiling element 602 may block only a portion of the ion beam 110 and a remainder of the ion beam 110 may impact the and the ion-sensitive element (e.g., ion-sensitive element 105). In other words, a "slice" of the ion beam 110 may be obstructed from impacting the ion-sensitive element (e.g., ion-sensitive element 105). Moreover, the ion beam profiling system 100 may operate in generally the same manners described above, except that the ion beam 110 is profiled based on absence of portions of the ion beam 110 impacting the ion-sensitive element (e.g., ion-sensitive element 105) and obstructed by the ion-sensitive profiling element 602.

Referring still to FIGS. 1-7 together, in additional embodiments, an external bias voltage may be applied in between the ion-sensitive element 105 and the current measuring device 106. In some embodiments, the external bias voltage may be between about 50 volts and about 90 volts. By biasing the ion-sensitive element 105, an emission of secondary electrons from the ion-sensitive element 105 may be at least partially suppressed. The foregoing may improve an accuracy of resulting current measurements. For example, the emission of secondary electrons may result in a loss of negative electrons, which is equivalent to the addition of positive current. As a result, emission of secondary electrons may influence current measurements and may artificially influence the current measurements to indicate that more ions are impacting the ion-sensitive element 105.

Figure 8:
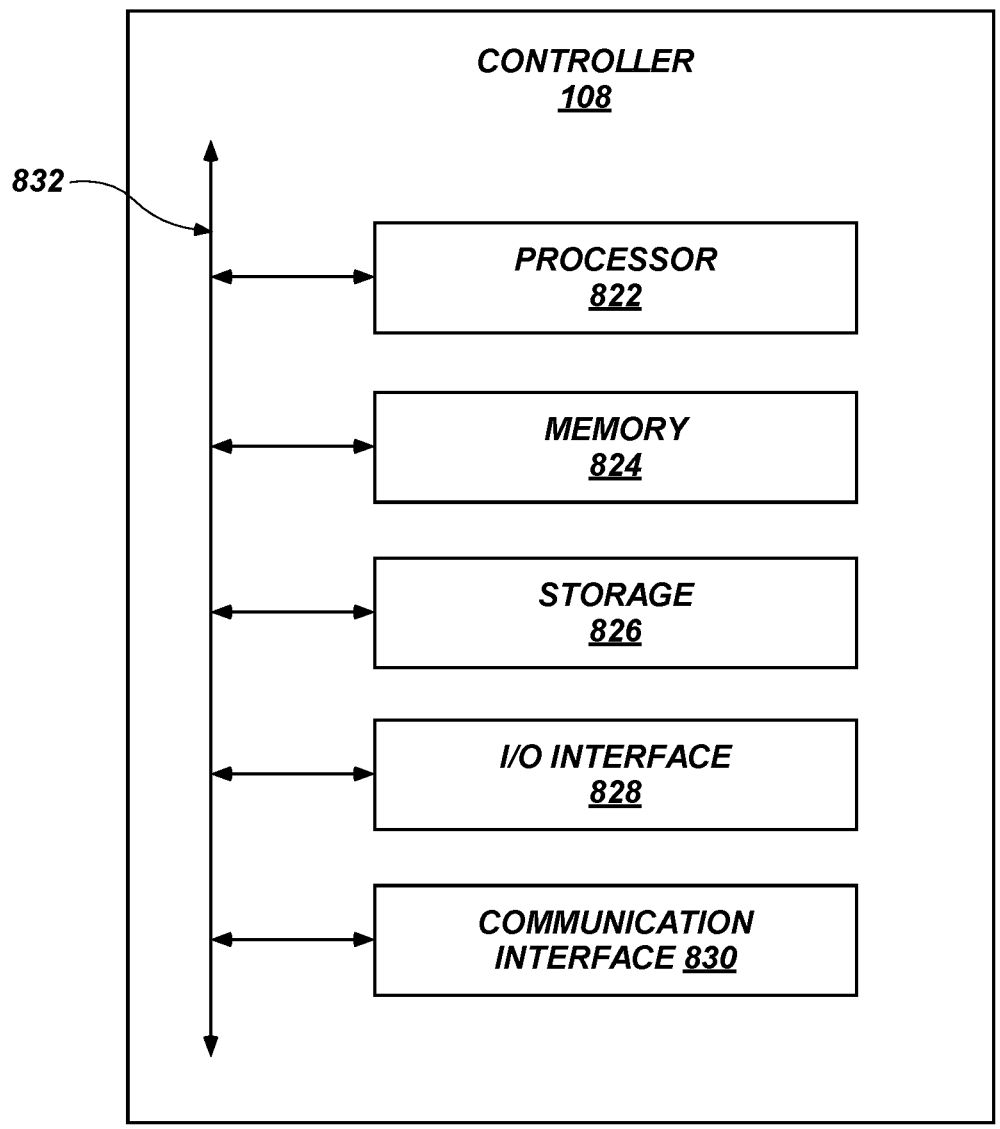
FIG. 8 shows a block diagram of an example controller of an ion beam profiling system according to one or more embodiments of the disclosure.

FIG. 8 illustrates a block diagram of an example controller 108 that may be configured (i.e., programmed) to perform one or more of the processes described above. One will appreciate that one or more computing devices may form the controller 108 of the ion beam profiling system 100. As shown by FIG. 8, the controller 108 can comprise a processor 822, a memory 824, a storage device 826, an I/O interface 828, and a communication interface 830, which may be communicatively coupled by way of a communication infrastructure. While an example controller 108 is shown in FIG. 8, the components illustrated in FIG. 8 are not intended to be limiting. Additional or alternative components may be used in other embodiments. Furthermore, in certain embodiments, the controller 108 can include fewer components than those shown in FIG. 8. Components of the controller 108 shown in FIG. 8 will now be described in additional detail.

In one or more embodiments, the processor 822 includes hardware for executing instructions, such as those making up a computer program. As an example, and not by way of limitation, to execute instructions, the processor 822 may retrieve (or fetch) the instructions from an internal register, an internal cache, the memory 824, or the storage device 826 and decode and execute them. In one or more embodiments, the processor 822 may include one or more internal caches for data, instructions, or addresses. As an example, and not by way of limitation, the processor 822 may include one or more instruction caches, one or more data caches, and one or more translation look aside buffers (TLBs). Instructions in the instruction caches may be copies of instructions in the memory 824 or the storage device 826.

The controller 108 includes memory 824, which is coupled to the processor(s) 822. The memory 824 may be used for storing data, metadata, and programs for execution by the processor(s). The memory 824 may include one or more of volatile and non-volatile memories, such as Random-Access Memory ("RAM"), Read-Only Memory ("ROM"), a solid state disk ("SSD"), Flash, Phase Change Memory ("PCM"), or other types of data storage. The memory 824 may be internal or distributed memory.

The controller 108 includes a storage device 826 that includes storage for storing data or instructions. As an example, and not by way of limitation, storage device 826 can comprise a non-transitory storage medium described above. The storage device 826 may include a hard disk drive (HDD), a floppy disk drive, Flash memory, an optical disc, a magneto-optical disc, magnetic tape, or a Universal Serial Bus (USB) drive or a combination of two or more of these. The storage device 826 may include removable or non-removable (or fixed) media, where appropriate. The storage device 826 may be internal or external to the controller 108. In one or more embodiments, the storage device 826 is non-volatile, solid-state memory. In other embodiments, the storage device 826 includes read-only memory (ROM). Where appropriate, this ROM may be mask programmed ROM, programmable ROM (PROM), erasable PROM (EPROM), electrically erasable PROM (EEPROM), electrically alterable ROM (EAROM), or Flash memory or a combination of two or more of these.

The controller 108 also includes one or more input or output ("I/O") devices/interfaces 828 (e.g., a touch display), which are provided to allow a user to provide input to, receive output from, and otherwise transfer data to and receive data from controller 108. The I/O devices/interfaces 828 may include a mouse, a keypad or a keyboard, a touch screen, a camera, an optical scanner, network interface, modem, other known I/O devices or a combination of such I/O device/interfaces. The touch screen may be activated with a stylus or a finger.

The I/O devices/interfaces 828 may include one or more devices for presenting output to a user, including, but not limited to, a graphics engine, a display (e.g., a display screen), one or more output drivers (e.g., display drivers), one or more audio speakers, and one or more audio drivers. In certain embodiments, the I/O interface 828 is configured to provide graphical data to a display for presentation to a user. The graphical data may be representative of one or more graphical user interfaces and/or any other graphical content as may serve a particular implementation.

The controller 108 can further include a communication interface 830. The communication interface 830 can include hardware, software, or both. The communication interface 830 can provide one or more interfaces for communication (such as, for example, packet-based communication) between the controller 108 and one or more other computing devices or networks. As an example, and not by way of limitation, the communication interface 830 may include a network interface controller (NIC) or network adapter for communicating with an Ethernet or other wire-based network or a wireless MC (WNIC) or wireless adapter for communicating with a wireless network, such as a WI-FI and/or Bluetooth. The controller 108 can further include a bus 832. The bus 832 can comprise hardware, software, or both that couples components of controller 108 to each other.

While the disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the invention as claimed, including legal equivalents thereof. In addition, features from one embodiment may be combined with features of another embodiment while still being encompassed within the scope of the disclosure as contemplated by the inventors. Further, embodiments of the disclosure have utility with different and various tool types and configurations.

What is claimed is:

1. An ion beam profiling system, comprising:
   a beam profiling element comprising:
      a plate of material having two parallel major surfaces;
      a first slit aperture extending through the plate of material and having a first longitudinal length extending in a direction parallel to the two parallel major surfaces; and
      a second slit aperture extending through the plate of material and having a second longitudinal length extending in a direction parallel to the two parallel major surfaces,
      wherein the first longitudinal length of the first slit aperture and the second longitudinal length of the second slit aperture each form an acute angle with a first direction defining a single degree of relative motion between the beam profiling element and an ion beam,
   an ion sensitive element electrically isolated from the beam profiling element;
   an ion source configured to emit the ion beam at the beam profiling element and the ion sensitive element; and
   a current measuring device coupled to the ion sensitive element.

2. The ion beam profiling system of claim 1, further comprising:
   a controller operably coupled to the ion source and the current measuring device, the controller comprising:
      at least one processor; and
      at least one non-transitory computer-readable storage medium storing instructions thereon that, when executed by the at least one processor, cause the ion beam profiling system to:
         emit, via the ion source, the ion beam at the beam profiling element and the ion sensitive element;
         cause the beam profiling element to translate in the first direction relative to the ion beam to cause the ion beam to pass over the first slit aperture and over the second slit aperture; and
         measure, via the current measuring device, a current generated in the ion sensitive element.

3. The ion beam profiling system of claim 2, wherein measuring the current generated in the ion sensitive element comprises:
   measuring current generated in the ion sensitive element while the ion beam passes over the first slit aperture; and
   measuring current generated in the ion sensitive element while the ion beam passes over the second slit aperture.

4. The ion beam profiling system of claim 3, further comprising instructions that, when executed by the at least one processor, cause the ion beam profiling system to reconstruct a two-dimensional profile of the ion beam based at least partially on the current measured while the ion beam passes over the first slit aperture and over the second slit aperture.

5. The ion beam profiling system of claim 4, wherein the reconstructed two-dimensional profile of the ion beam shows a distribution of an intensity of the ion beam throughout a cross-section of the ion beam.

6. The ion beam profiling system of claim 3, wherein measuring the current generated in the ion sensitive element while the ion beam passes over the first slit aperture comprises measuring a current profile caused by the ion beam along a first axis of the ion beam.

7. The ion beam profiling system of claim 1, wherein measuring the current generated in the ion sensitive element while the ion beam passes over the second slit aperture comprises measuring a current profile caused by the ion beam along a second axis of the ion beam, wherein the second axis of the ion beam is perpendicular to first axis of the ion beam.

8. The ion beam profiling system of claim 2, wherein cause the beam profiling element to translate in a first direction relative to the ion beam to cause the ion beam to pass over the first slit aperture and over the second slit aperture comprises causing an entire cross-section of the ion beam to pass through both the first slit aperture and the second slit aperture incrementally.

9. The ion beam profiling system of claim 1, wherein the ion source is configured to emit the ion beam with a diameter that is smaller than a length of each of the first longitudinal length and the second longitudinal length.

10. A method profiling an ion beam, the method comprising:
   emitting an ion beam at a beam profiling element and an ion sensitive element;
   causing at least the beam profiling element to translate relative to the ion beam in a first direction;
   causing the ion beam to pass over a first slit aperture extending through the beam profiling element and having a first longitudinal length extending in a direction parallel to a major surface of the beam profiling element;
   causing the ion beam to pass over a second slit aperture extending through the beam profiling element and having a second longitudinal length extending in a direction parallel to the major surface of the beam profiling element, wherein the second longitudinal length of the second slit aperture is perpendicular to the first longitudinal length of the first slit aperture;
   measuring current generated in the ion sensitive element while the ion beam passes over the first slit aperture of the beam profiling element;
   measuring current generated in the ion sensitive element while the ion beam passes over the second slit aperture of the beam profiling element; and
   reconstructing a two-dimensional profile of the ion beam based at least partially on the current measured while the ion beam passes over the first slit aperture and the second slit aperture,
   wherein an angle defined between the first direction in which the beam profiling element is translated relative to the ion beam and the first longitudinal length of the first slit aperture is about 45°, and wherein an angle defined between the first direction in which the beam profiling element is translated relative to the ion beam and the second longitudinal length of the second slit aperture is about 45°.

11. The method of claim 10, wherein the first direction in which the beam profiling element is translated relative to the ion beam is perpendicular to a beam path of the ion beam.

12. The method of claim 10, wherein the first longitudinal length and the second longitudinal length are each longer than a diameter of the ion beam.

13. The method of claim 10, wherein the reconstructed two-dimensional profile of the ion beam shows a distribution of an intensity of the ion beam throughout a cross-section of the ion beam.

14. The method of claim 10, wherein measuring current generated in the ion sensitive element while the ion beam passes over the first slit aperture comprising measuring a current profile caused by the ion beam along a first axis of the ion beam.

15. The method of claim 14, wherein measuring current generated in the ion sensitive element while the ion beam passes over the second slit aperture comprising measuring a current profile caused by the ion beam along a second axis of the ion beam, wherein the second axis of the ion beam is perpendicular to the first axis of the ion beam.

16. An ion beam profiling system, comprising:
a beam profiling element comprising:
a first profiling element having a first longitudinal axis; and
a second profiling element having a second longitudinal axis, wherein the first longitudinal axis of the first profiling element and the second longitudinal axis of the second profiling element each form an acute angle with a first direction defining a single degree of relative motion between the beam profiling element and an ion beam;
an ion source configured to emit the ion beam at the beam profiling element.

17. The ion beam profiling system of claim 16, wherein the beam profiling element comprises an elongated member, wherein the first profiling element comprises a first linear portion of the elongated member, and wherein the second profiling element comprises a second, different linear portion of the elongated member.

18. The ion beam profiling system of claim 16, wherein the beam profiling element comprises a plate of material, wherein the first profiling element comprises a first slit aperture formed in the plate of material, and wherein the second profiling element comprises a second slit aperture formed in the plate of material.

19. The ion beam profiling system of claim 16, further comprising:
a controller operably coupled to the ion source, the controller comprising:
at least one processor; and
at least one non-transitory computer-readable storage medium storing instructions thereon that, when executed by the at least one processor, cause the ion beam profiling system to:
emit, via the ion source, the ion beam at the beam profiling element; and
cause the beam profiling element to translate in the first direction relative to the ion beam to cause the ion beam to pass over the first profiling element and over the second profiling element.

20. The ion beam profiling system of claim 19, further comprising instructions that, when executed by the at least one processor, cause the ion beam profiling system to measure, via a current measuring device, a current generated in an ion sensitive element electrically isolated from the beam profiling element.

21. An ion beam profiling system, comprising:
a beam profiling element comprising:
a plate of material having two parallel major surfaces;
a first slit aperture extending through the plate of material and having a first longitudinal length extending in a direction parallel to the two parallel major surfaces; and
a second slit aperture extending through the plate of material and having a second longitudinal length extending in a direction parallel to the two parallel major surfaces,
wherein the first longitudinal length of the first slit aperture is perpendicular to the second longitudinal length of the second slit aperture,
an ion sensitive element electrically isolated from the beam profiling element;
an ion source configured to emit an ion beam at the beam profiling element and the ion sensitive element;
a current measuring device coupled to the ion sensitive element; and
a controller operably coupled to the ion source and the current measuring device, the controller comprising:
at least one processor; and
at least one non-transitory computer-readable storage medium storing instructions thereon that, when executed by the at least one processor, cause the ion beam profiling system to:
emit, via the ion source, the ion beam at the beam profiling element and the ion sensitive element;
cause the beam profiling element to translate in a first direction relative to the ion beam to cause the ion beam to pass over the first slit aperture and over the second slit aperture; and
measure, via the current measuring device, a current generated in the ion sensitive element,
wherein an angle defined between the first direction in which the beam profiling element is translated relative to the ion beam and the first longitudinal length of the first slit aperture is about 45°, and wherein an angle defined between the first direction in which the beam profiling element is translated relative to the ion beam and the second longitudinal length of the second slit aperture is about 45°.

22. An ion beam profiling system, comprising:
a beam profiling element comprising:
a plate of material having two parallel major surfaces;
a first slit aperture extending through the plate of material and having a first longitudinal length extending in a direction parallel to the two parallel major surfaces; and
a second slit aperture extending through the plate of material and having a second longitudinal length extending in a direction parallel to the two parallel major surfaces;
an ion sensitive element electrically isolated from the beam profiling element;
an ion source configured to emit an ion beam having a diameter that is smaller than a length of each of the first longitudinal length and the second longitudinal length at the beam profiling element and the ion sensitive element; and
a current measuring device coupled to the ion sensitive element.

* * * * *

UNITED STATES PATENT AND TRADEMARK OFFICE
CERTIFICATE OF CORRECTION

PATENT NO.         : 11,598,890 B2
APPLICATION NO.    : 16/946344
DATED              : March 7, 2023
INVENTOR(S)        : Chase N. Taylor It is certified that error appears in the above-identified patent and that said Letters Patent is hereby corrected as shown below:

In the Specification
    Column 16,   Line 62,   change "wireless MC (WNIC)" to --wireless NIC (WNIC)--

In the Claims
Claim 7,   Column 18,   Line 13,   change "claim 1," to --claim 6,--
Claim 7,   Column 18,   Line 18,   change "to first axis" to --to the first axis--

Signed and Sealed this
Seventh Day of November, 2023

Katherine Kelly Vidal
*Director of the United States Patent and Trademark Office*